United States Patent [19]

Coppa

[11] Patent Number: 5,238,913
[45] Date of Patent: Aug. 24, 1993

[54] SUPERCONDUCTING MICROCIRCUITRY BY THE MICROLITHGRAPHIC PATTERNING OF SUPERCONDUCTING COMPOUNDS AND RELATED MATERIALS

[75] Inventor: Nicholas V. Coppa, Los Alamos, N. Mex.

[73] Assignee: The United States of America as represented by the United States Department of Energy, Washington, D.C.

[21] Appl. No.: 860,337

[22] Filed: Mar. 30, 1992

[51] Int. Cl.$^5$ ............................................. H01L 39/00
[52] U.S. Cl. ........................................ 505/1; 505/725; 505/728; 505/742; 156/655; 156/656; 156/659.1; 156/667; 204/192.34
[58] Field of Search .................. 505/1, 725, 728, 742; 156/659.1, 667, 655, 656; 427/43.1, 62; 204/192.34

[56] References Cited

U.S. PATENT DOCUMENTS

| | | | |
|---|---|---|---|
| 4,892,862 | 1/1990 | Ogushi et al. | 505/1 |
| 4,954,480 | 9/1990 | Imanaka et al. | 505/1 |
| 4,960,752 | 10/1990 | Ashok et al. | 505/1 |
| 4,971,948 | 11/1990 | Dam et al. | 156/656 X |
| 4,997,809 | 3/1991 | Gupta | 505/1 |
| 5,017,551 | 5/1991 | Agostinelli et al. | 505/1 |

*Primary Examiner*—Thi Dang
*Attorney, Agent, or Firm*—Milton D. Wyrick; Paul D. Gaetjens; William R. Moser

[57] ABSTRACT

Superconducting microcircuits including a thin layer of $Ba_2Cu_3O_{5+x}$ ($0<x<1$) on a substrate. A thin layer of a dopant; for example, $Y_2O_3$ for superconducting patterns of $YBa_2Cu_3O_{7-x}$, or $Pr_2O_3$ for insulator patterns of $PrBa_2Cu_3O_{7-x}$. These layers are covered with a layer of photoresist, which is exposed to light through a mask having a pattern for a desired circuit. The photoresist is then developed to reveal a pattern of the thin dopant layer which will be etched away. The microcircuit is then etched and stripped to remove the unneeded portion of the thin dopant layer. Finally, the microcircuit is heated at a temperature and for a period of time sufficient to diffuse and react the dopant layer with the thin layer of $Ba_2Cu_3O_{5+x}$, forming a pattern of superconductor or insulator.

21 Claims, 1 Drawing Sheet

SUPERCONDUCTING MICROCIRCUITRY BY THE MICROLITHGRAPHIC PATTERNING OF SUPERCONDUCTING COMPOUNDS AND RELATED MATERIALS

The invention is a result of a contract with the Department of Energy (Contract No. W-7405-ENG-36).

BACKGROUND OF THE INVENTION

The present invention generally relates to a electronic microcircuitry, and, more specifically, to the fabrication of superconducting microcircuitry.

From their advent in the late 1950's-early 1960's, conventional microcircuitry has revolutionized the electronics industry. Electronic circuits, which in the past had been either wired point to point or on a printed circuit board, could now be generated on a chip not much larger than the size of a postage stamp. Additionally, since mass production techniques were applicable, the cost of the chips was originally much lower than more conventional circuitry, and the prices have continued to fall over time.

Of course, microlithography is now in widespread use in the fabrication of silicon based microcircuitry, a technology that has brought about a revolution in all areas of electronics. Although the fabrication process is detailed and exacting, it allows the fabrication of intricate electronic circuits, containing thousands of components, within the constraints of a small chip.

With the discovery of the new high temperature superconducting compounds in 1986, scientific interest turned immediately to developing commercial applications for the compounds. Of all the possibilities for use of the new compounds, the one which should garner the greatest enthusiasm would seem to be their application to microcircuitry, as it would engender a revolution in electronics perhaps even more monumental than that caused by the silicon based technology. However, developing this application has proved to be a daunting task, primarily because of difficulties in laying thin superconducting films and in finding compatible insulating materials.

Only recently have Josephson junction devices been fabricated on a thin film. One process for creating such a thin film Josephson junction device involves the epitaxial build-up of three layers, superconductor, insulator, superconductor. This build-up of layers is followed by ion milling techniques to cut the device out of the layers. A second technique involves the growth of epitaxial layers oriented at large angles (approximately 45°). Proper selection of material type and growth conditions allows fabrication of a device. Both of these processes are cumbersome and costly, and do not lend themselves to miniaturization or high device density. In the present state of these processes, only a limited number o f devices can be fabricated on a single chip.

Recently, a new semiconducting phase was discovered in the high temperature superconducting system, Y-Ba-Cu-O. This relatively new phase is $Ba_2Cu_3O_{5+x}$ ($0 < x < 1$). This semiconducting material was first reported in 1989. The important aspect of this discovery for the present invention is that $Ba_2Cu_3O_{5+x}$ reacts with $Y_2O_3$ to form the high temperature superconducting composition of $YBa_2Cu_3O_{7-x}$. When $Ba_2Cu_3O_{5+x}$ is reacted with $Pr_2O_3$, an insulator, $PrBa_2Cu_3O_{7-x}$, is formed. Thus, this semiconducting phase, $Ba_2Cu_3O_{5+x}$, is an excellent precursor for the production of superconducting devices on chips.

It is therefore an object of the present invention to provide superconducting devices using microlithography.

It is a further object of the present invention to provide patterns of either superconducting material or insulator material.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the method of this invention for producing superconducting microcircuits comprises the steps of first depositing a thin film of $Ba_2Cu_3O_{5+x}$ onto a substrate. Next, a thin film of a dopant is deposited onto the thin film of $Ba_2Cu_3O_{5+x}$. Then, a photoresist is deposited onto the thin film of a dopant. A light is shone through a mask containing a pattern for a desired circuit configuration and onto the photoresist. The photoresist is developed to clear the photoresist from the dopant layer in the pattern of the mask. The cleared pattern of said dopant layer is then etched from the thin film of $Ba_2Cu_3O_{5+x}$, and the microcircuits are heated at a temperature and for a period of time sufficient to diffuse and react the dopant with the thin film of $Ba_2Cu_3O_{5+x}$.

In a further aspect of the present invention, and in accordance with its objects and principles, a method of producing superconducting microcircuits comprises the steps of depositing a thin film of $Ba_2Cu_3O_{5+x}$ ($0 < x < 1$) onto a base, followed by depositing a thin film of a dopant onto the thin film of $Ba_2Cu_3O_{5+x}$. Next, a mechanical mask representing a desired circuit configuration is placed onto the thin film of dopant. An ion mill is then used to etch away undesired dopant. The microcircuits are then heated at a temperature and for a period of time sufficient to diffuse and react the desired circuit configuration of dopant with the thin film of $Ba_2Cu_3O_{5+x}$.

In a further aspect of the present invention, and in accordance with its objects and principles, a method of producing superconducting microcircuits comprises the steps of depositing a thin film of $Ba_2Cu_3O_{5+x}$ ($0 < x < 1$) onto a base, and placing a mechanical mask representing a desired circuit configuration onto the thin film of dopant. Next, the thin film of $Ba_2Cu_3O_{5+x}$ is doped with ions by way of ion implantation. The mechanical mask is then removed, and the microcircuits are heated at a temperature and for a period of time sufficient to anneal the thin film of $Ba_2Cu_3O_{5+x}$ containing the dopant ions.

In a further aspect of the present invention, and in accordance with its objects and principles, a superconducting microcircuit comprises a base with a thin film of $Ba_2Cu_3O_{5+x}$ ($0 < x < 1$) deposited onto the base. A thin film of a dopant is deposited onto the thin film of $Ba_2Cu_3O_{5+x}$ in a desired pattern, and the thin film of a dopant is diffused into and reacted with the thin film of $Ba_2Cu_3O_{5+x}$.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION

Figure 1:
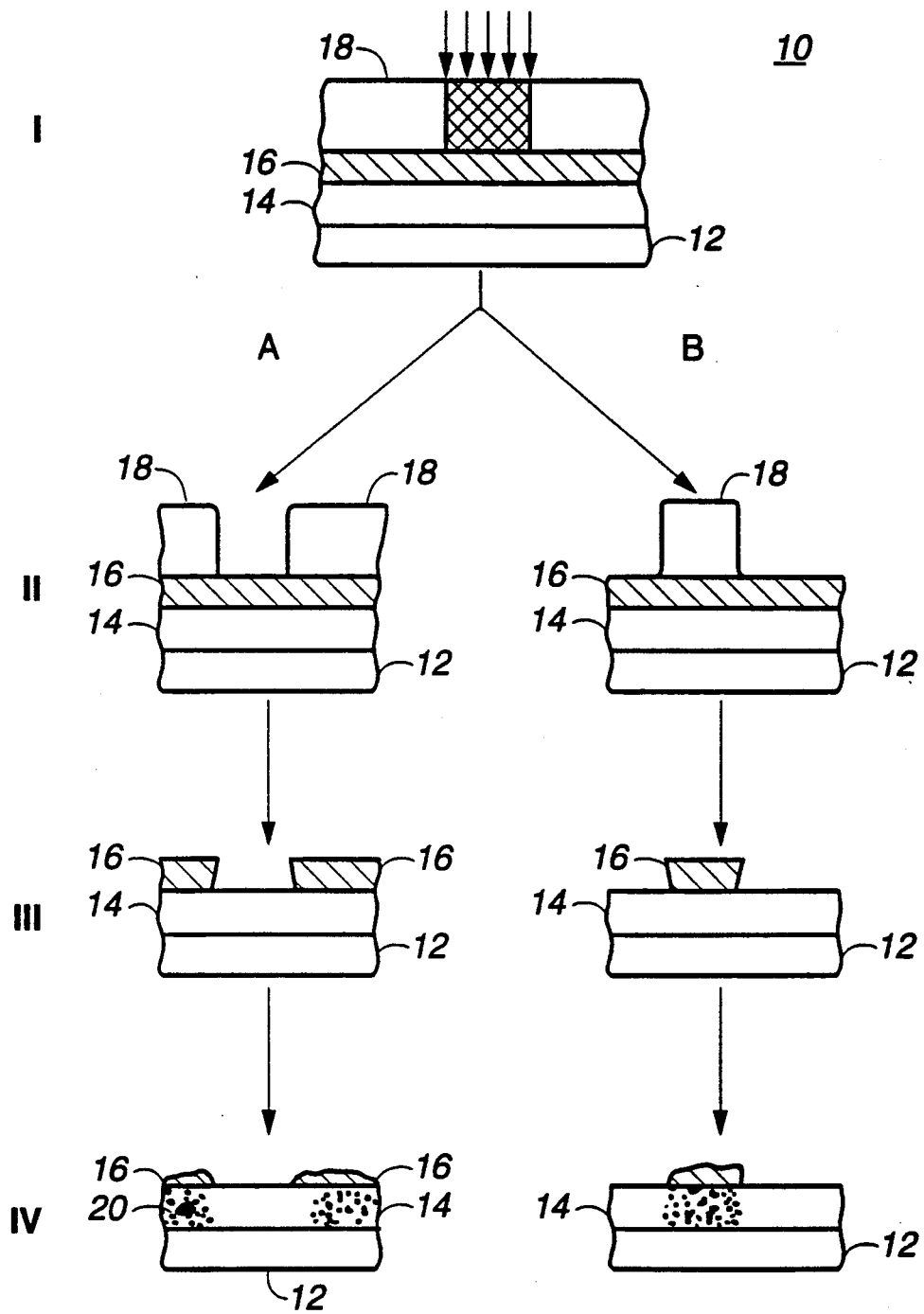
FIG. 1 is a schematic drawing of the steps involved with the present invention; the two paths designated A and B illustrate the appearance for positive and negative resists, and the steps are designated as I-V.

The present invention provides a method whereby superconducting microlithographic devices can be manufactured with many components on a single chip. This method is based on the fact that $Ba_2Cu_3O_{5+x}$ reacts with $Y_2O_3$ to form the high temperature superconducting composition $YBa_2Cu_3O_{7-x}$ ($0<x<1$). When $Ba_2Cu_3O_{5+x}$ is reacted with $Pr_2O_3$, an insulator, $PrBa_2Cu_3O_{7-x}$, is formed. This means that this semiconducting phase, $Ba_2Cu_3O_{5+x}$, is an excellent precursor for the production of superconducting devices on chips.

In the invention, $Ba_2Cu_3O_{5+x}$ is employed as a base material, and rare earth oxides such as $Y_2O_3$ and $Pr_2O_3$ are dopants. This is directly analogous to the use of silicon as a base material and Phosphorous, Arsenic or Gallium as dopants in conventional silicon technology. As previously discussed, prior attempts at superconducting microlithography have not been particularly successful because they rely on the deposition or build-up of $YBa_2Cu_3O_{7-x}$. Such processes are at the mercy of the deposition geometry, a geometry that is very limited for $YBa_2Cu_3O_{7-x}$.

Reference is now directed to FIG. 1, where one possible method of implementing the present invention is illustrated schematically. In FIG. 1, two paths, A and B, are illustrated. The path denoted, "A," produces a positive resist, while the path denoted, "B," produces a negative resist. Both path A and path B originate from a conventionally prepared chip 10 comprising a substrate 12 with deposited layers overlaying substrate 12. Substrate 12 could be any substrate which is compatible with the deposited layers. Crystalline or polycrystalline materials, such as magnesium oxide (MgO) or lanthanum aluminate are suitable. Chip 10 is shown at I.

Onto substrate 12, thin film layer 14 is deposited, with layer 14 comprising $Ba_2Cu_3O_{5+x}$ ($0<x<1$). Next dopant layer 16 is applied onto thin film layer 14. Dopant layer 16 may comprise a rare earth oxide, such as $Y_2O_3$ for a superconducting region, or another suitable dopant, perhaps to form an insulating region. After application of dopant layer 16, a layer of photoresist 18 is deposited. Thereafter, photoresist 18 is exposed to light shining through a mask which is in the desired circuit configuration. As is true with conventional microlithography, the light has caused photoresist 18 to become differentially soluble to an appropriate resist etching solution agent Subsequent developing results in either the positive resist or the negative resist, shown at II.

Next, chip 10 is conventionally stripped to produce alternating areas which are either covered by dopant 16 or are uncovered. The result of this process is illustrated at III. As shown in path A, there are remaining volumes of dopant layer 16, which will be in the form of the mask through which light was shown.

Subsequently, chip 10 is conventionally post heated to a temperature and for a period of time sufficient to produce diffusion of dopant layer 16 into layer 14. This diffusion, illustrated schematically at IV, allows dopant layer 16, be it, for example, either $Y_2O_3$ or $Pr_2O_3$, depending on the desired result, to react with layer 14, the thin film of $Ba_2Cu_3O_{5+x}$. A dopant layer 16 comprising $Y_2O_3$ produces mask created patterns of superconducting $YBa_2Cu_3O_{7-x}$; while a dopant layer 16 of $Pr_2O_3$ produces $PrBa_2O_{7-x}$, an insulator.

It should be understood that dopant layer 16 may be comprised of materials different from $Y_2O_3$ or $Pr_2O_3$, depending on the desired final material. Doping layer 14 with rare earth oxides of Y, La, Nd, Sm, Eu, Gd, Dy, Ho, Er, Tm, Yb, and Lu is expected to yield superconducting microlithographic pathways having application specific transition temperatures, with Tc's in the range of 59K to 93K.

In similar fashion, dopant layer 16 can comprise, in addition to $Pr_2O_3$, rare earth oxides Ce, Pm, or Tb can be used to form insulating regions. By appropriate circuit design, and fabrication sequence, as taught herein, thousands of superconducting devices can be patterned onto a single chip.

In an alternative process, which will be described using FIG. 1, but without further illustration, involves using a mechanical mask (not shown). In this case, a mechanical mask in the configuration of a desired circuit would be laid over dopant layer 16. Afterward, and ion mill (not shown) is used to etch away the unneeded portions of dopant layer 16. The post heating process follows, and is as previously described.

In another alternative process, again using FIG. 1 without further illustration, also uses a mechanical mask in the configuration of a desired circuit. However, in this case, the mask is laid over layer 14, the thin film of $Ba_2Cu_3O_{5+x}$. Layer 14 is then doped using ion implantation with a beam of appropriate ions of rare earth oxides. For example, yttrium ions could be implanted in superconducting regions, and prascodymium ions could be implanted in insulating regions. As before, this implantation is followed by the above-described post heating to produce the superconducting and insulating regions.

The foregoing description of the preferred embodiments of the invention have been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of producing superconducting microcircuits comprising the steps of:

depositing a thin film of $Ba_2Cu_3O_{5+x}$ ($0<x<1$) onto a substrate;

depositing a thin film of a dopant onto said thin film of $Ba_2Cu_3O_{5+x}$;

depositing a photoresist onto said thin film of a dopant;

shining light through a mask containing a pattern for a desired circuit configuration and onto said photoresist;

developing said photoresist to remove portions of said photoresist shined by the light and to selectively expose said dopant film;

etching said selectively exposed dopant film from said thin film of $Ba_2Cu_3O_{5+x}$ to form a pattern of dopant; and heating said substrate at a temperature and for a period of time sufficient to diffuse and react said pattern of dopant with said thin film of $Ba_2Cu_3O_{5+x}$.

2. The method described in claim 1, wherein said thin film of dopant comprises a rare earth oxide.

3. The method described in claim 1, wherein said thin film of dopant comprises $Y_2O_3$.

4. The method described in claim 2, wherein said rare earth oxide comprises $Pr_2O_3$.

5. The method described in claim 1, wherein said substrate comprises a crystalline or polycrystalline material.

6. The method described in claim 5, wherein said crystalline or polycrystalline material comprises lanthanum aluminate.

7. The method described in claim 5, wherein said crystalline or polycrystalline material comprises magnesium oxide.

8. A method of producing superconducting microcircuits comprising the steps of:

depositing a thin film of $Ba_2Cu_3O_{5+x}$ ($0<x<1$) onto a substrate;

depositing a thin film of a dopant onto said thin film of $Ba_2Cu_3O_{5+x}$;

placing a mechanical mask representing a desired circuit configuration onto said thin film of dopant;

etching away undesired dopant which is not covered by said mechanical mask using a ion mill;

heating said substrate at a temperature and for a period of time sufficient to diffuse and react said pattern of dopant with said thin film of $Ba_2Cu_3O_{5+x}$.

9. The method described in claim 8, wherein said thin film of dopant comprises a rare earth oxide.

10. The method described in claim 8, wherein said thin film of dopant comprises $Y_2O_3$.

11. The method described in claim 9, wherein said rare earth oxide comprises $Pr_2O_3$.

12. The method described in claim 8, wherein said substrate comprises a crystalline or polycrystalline material.

13. The method described in claim 12, wherein said crystalline or polycrystalline material comprises lanthanum aluminate.

14. The method described in claim 12, wherein said crystalline or polycrystalline material comprises magnesium oxide.

15. A method of producing superconducting microcircuits comprising the steps of:

depositing a thin film of $Ba_2Cu_3O_{5+x}$ ($0<x<1$) onto a substrate;

placing a mechanical mask representing a desired circuit configuration onto said thin film of $Ba_2Cu_3O_{5+x}$ doping said thin film of $Ba_2Cu_3O_{5+x}$ with dopant ions by way of ion implantation;

removing said mechanical mask;

heating said substrate at a temperature and for a period of time sufficient to diffuse and react said dopant ions with said thin film of $Ba_2Cu_3O_{5+x}$.

16. The method described in claim 15 wherein said dopant ions comprise ions of a rare earth oxide.

17. The method described in claim 15, wherein said thin film of dopant comprises $Y_2O_3$.

18. The method described in claim 16, wherein said rare earth oxide comprises $Pr_2O_3$.

19. The method described in claim 15, wherein said substrate comprises a crystalline or polycrystalline material.

20. The method described in claim 19, wherein said crystalline or polycrystalline material comprises lanthanum aluminate.

21. The method described in claim 19, wherein said crystalline or polycrystalline material comprises magnesium oxide.

* * * * *